United States Patent
Abe

(10) Patent No.: US 11,287,744 B2
(45) Date of Patent: Mar. 29, 2022

(54) EXTREME ULTRAVIOLET LIGHT GENERATION APPARATUS, TARGET CONTROL METHOD, AND ELECTRONIC DEVICE MANUFACTURING METHOD

(71) Applicant: Gigaphoton Inc., Tochigi (JP)

(72) Inventor: Toru Abe, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/369,794

(22) Filed: Jul. 7, 2021

(65) Prior Publication Data

US 2021/0333716 A1    Oct. 28, 2021

Related U.S. Application Data

(63) Continuation of application No. PCT/JP2019/004837, filed on Feb. 12, 2019.

(51) Int. Cl.
*G03F 7/20* (2006.01)

(52) U.S. Cl.
CPC ...... *G03F 7/70025* (2013.01); *G03F 7/70058* (2013.01)

(58) Field of Classification Search
CPC .......... G03F 7/70025; G03F 7/70058
See application file for complete search history.

(56) References Cited

U.S. PATENT DOCUMENTS

| | | |
|---|---|---|
| 7,164,144 B2 | 1/2007 | Partlo et al. |
| 2010/0294958 A1 | 11/2010 | Hayashi et al. |
| 2014/0111635 A1 | 4/2014 | Suzuki et al. |
| 2014/0261761 A1 | 9/2014 | Vaschenko et al. |
| 2016/0370706 A1 | 12/2016 | Imachi et al. |
| 2017/0358442 A1 | 12/2017 | Hosoda et al. |
| 2018/0177036 A1 | 6/2018 | Hosoda et al. |
| 2018/0352641 A1 | 12/2018 | Nishimura et al. |

(Continued)

FOREIGN PATENT DOCUMENTS

| | | |
|---|---|---|
| JP | 2011-003887 A | 1/2011 |
| JP | 2014-086523 A | 5/2014 |

(Continued)

OTHER PUBLICATIONS

International Search Report issued in PCT/JP2019/004837; dated Apr. 9, 2019.

(Continued)

*Primary Examiner* — Peter B Kim
(74) *Attorney, Agent, or Firm* — Studebaker & Brackett PC

(57) ABSTRACT

An extreme ultraviolet light generation apparatus is an apparatus to generate extreme ultraviolet light by irradiating a target with laser light, and may include a target supply unit configured to output the target, an actuator configured to shift a trajectory of the target, a first trajectory sensor configured to detect the trajectory of the target in a first direction, a second trajectory sensor configured to detect the trajectory of the target in a second direction being different from the first direction, and a control unit configured to perform trajectory control including controlling the actuator to cause the second trajectory sensor to be capable of detecting the trajectory of the target when the trajectory of the target has been detected by the first trajectory sensor and has not been detected by the second trajectory sensor.

19 Claims, 10 Drawing Sheets

(56) References Cited

U.S. PATENT DOCUMENTS

2019/0274210 A1* 9/2019 Rafac .................... H05G 2/008
2021/0349400 A1* 11/2021 Abe .................... G03F 7/70525

FOREIGN PATENT DOCUMENTS

| JP | 2018-185548 A | 11/2018 |
| WO | 2014/051891 A1 | 4/2014 |
| WO | 2016/147910 A1 | 9/2016 |
| WO | 2017/042881 A1 | 3/2017 |
| WO | 2017/154528 A1 | 9/2017 |

OTHER PUBLICATIONS

International Preliminary Report on Patentability and Written Opinion issued in PCT/JP2019/004837; dated Aug. 10, 2021.

* cited by examiner

FIG.3A
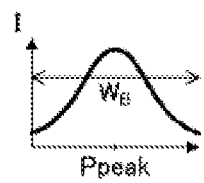
FIG.3C
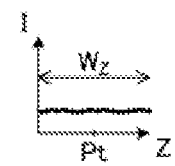
FIG.3B
FIG.3D
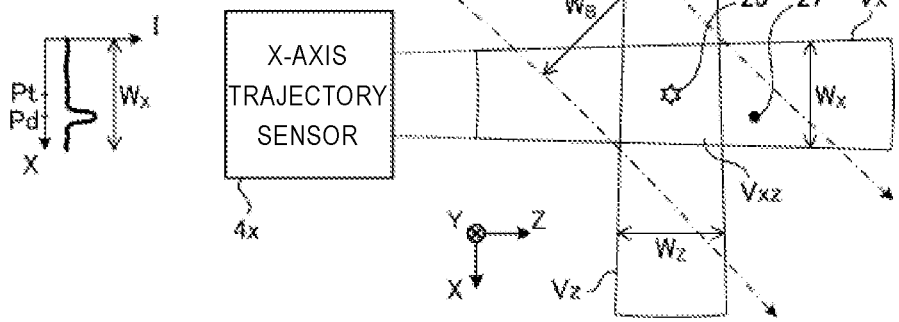

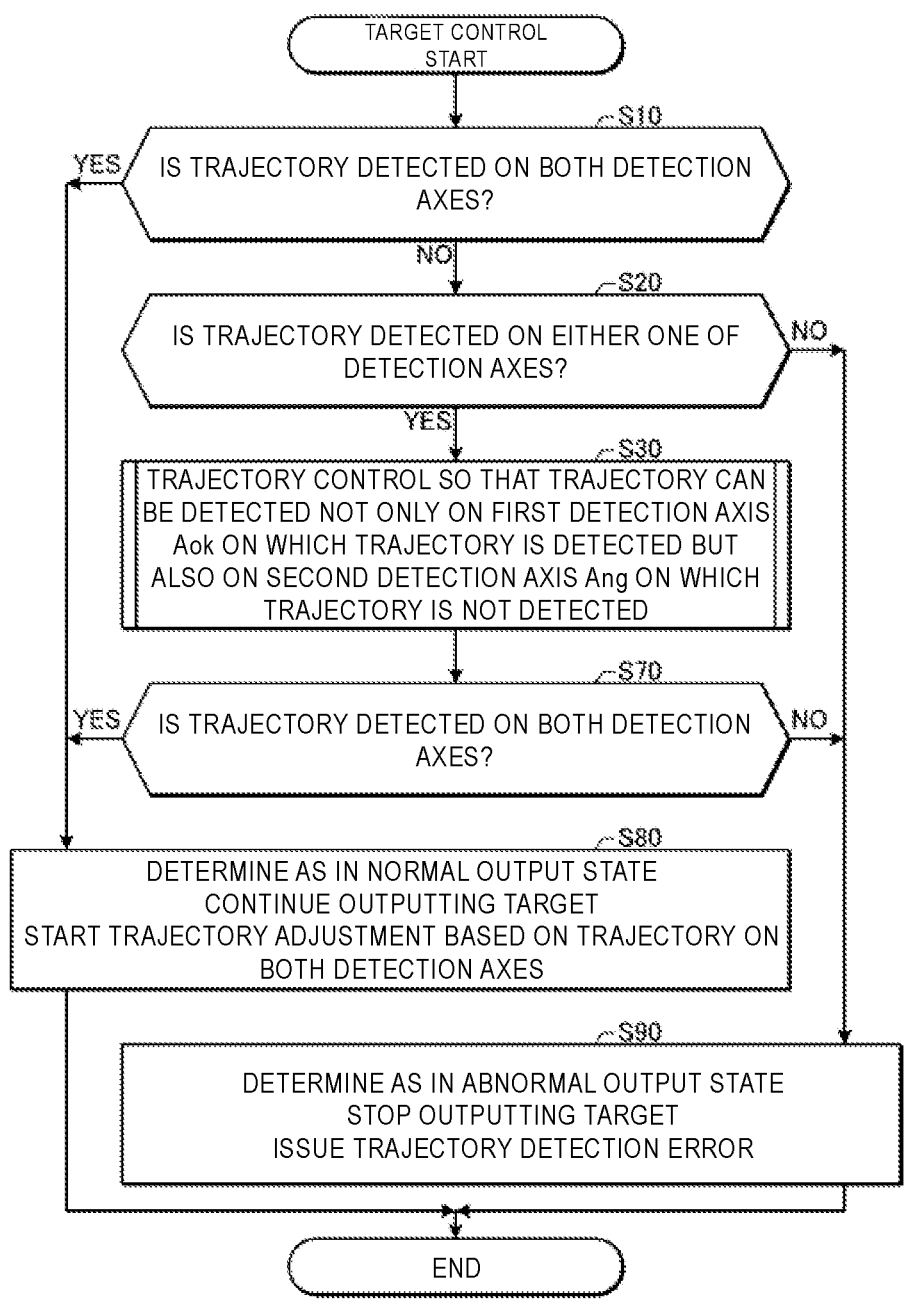

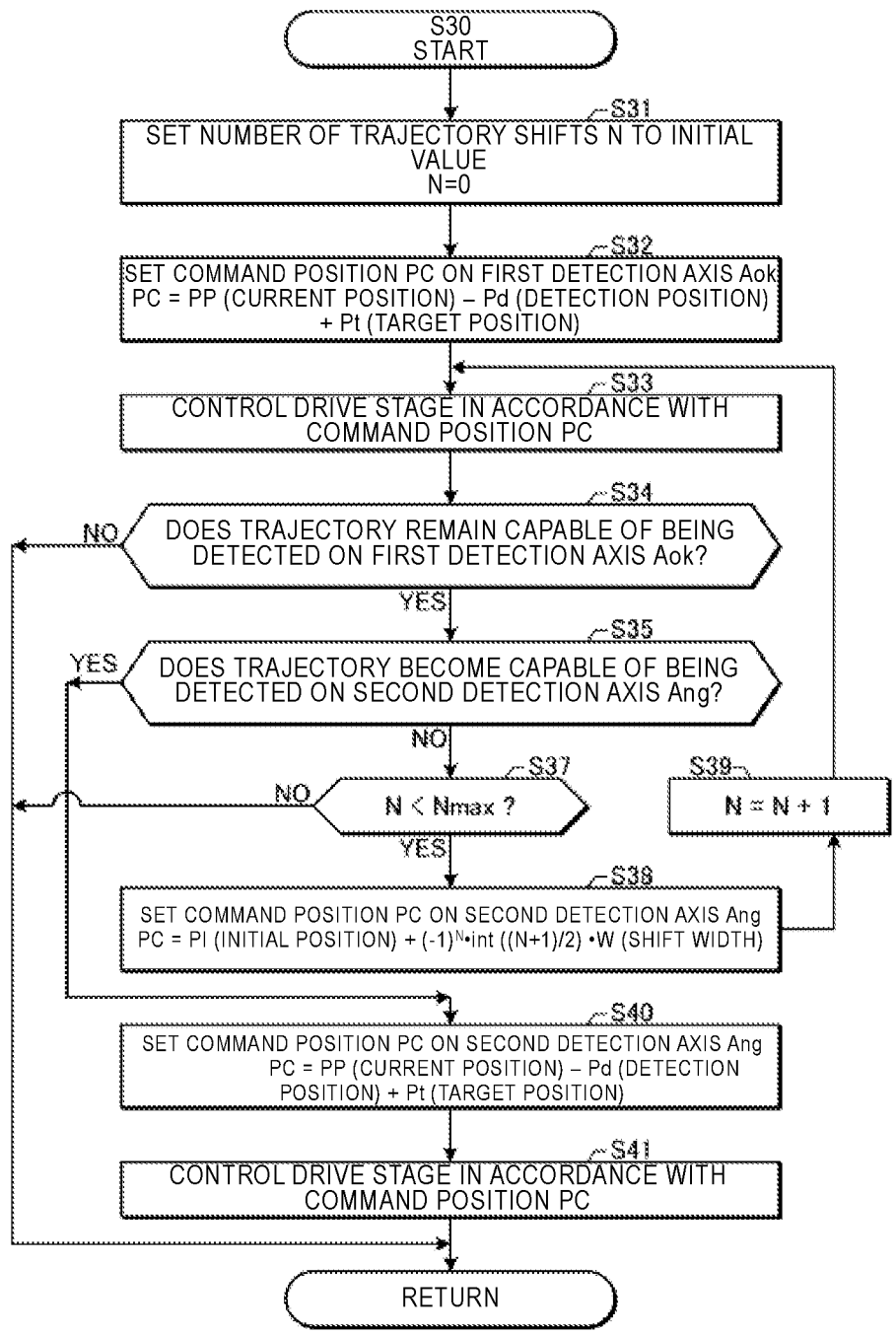

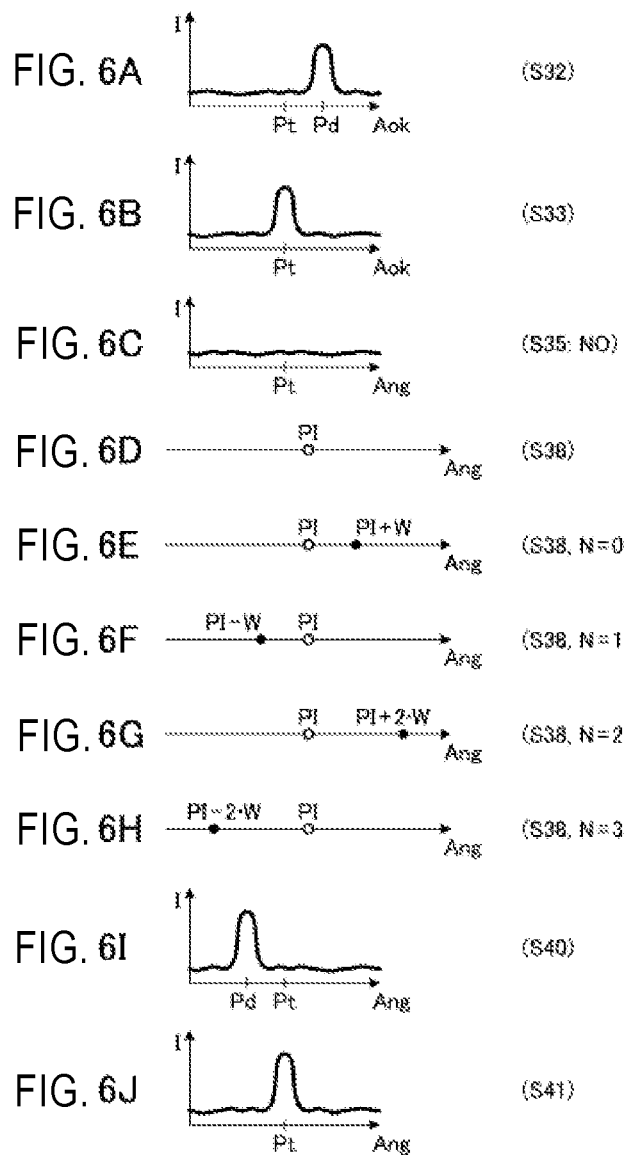

FIG. 9F 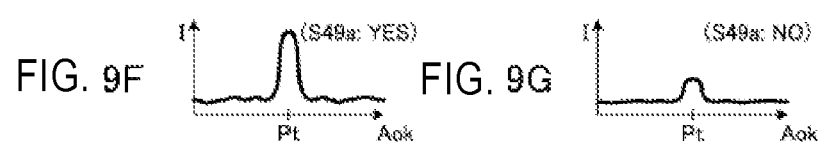 FIG. 9G
FIG. 9H 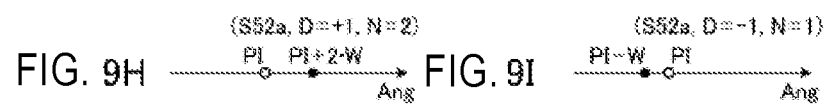 FIG. 9I 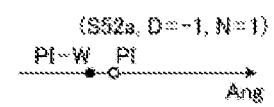
FIG. 9J 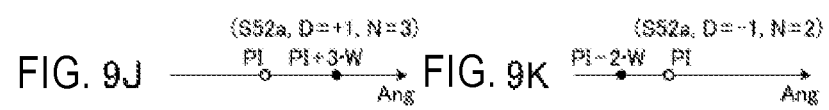 FIG. 9K 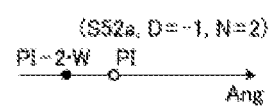

EXTREME ULTRAVIOLET LIGHT GENERATION APPARATUS, TARGET CONTROL METHOD, AND ELECTRONIC DEVICE MANUFACTURING METHOD

CROSS-REFERENCE TO RELATED APPLICATIONS

The present application claims the benefit of International Application No. PCT/JP2019/004837, filed on Feb. 12, 2019, the entire contents of which are hereby incorporated by reference.

BACKGROUND

1. Technical Field

The present disclosure relates to an extreme ultraviolet light generation apparatus, a target control method, and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 70 to 45 nm and further at 32 nm or less will be required. Therefore, in order to meet the demand for fine processing of, for example, 32 nm or less, the development of an exposure apparatus that combines an extreme ultraviolet (EUV) light generation apparatus that generates EUV light having a wavelength of about 13 nm and reduced projection reflection optics is expected.

As an EUV light generation apparatus, three types of apparatuses have been proposed: a laser produced plasma (LPP) type apparatus using plasma generated by irradiating a target substance with pulse laser light, a discharge produced plasma (DPP) type apparatus using plasma generated by discharge, and a synchrotron radiation (SR) type apparatus using synchrotron radiation.

LIST OF DOCUMENTS

Patent Documents

Patent Document 1: U.S. Pat. No. 7,164,144
Patent Document 2: US Patent Application Publication No. 2016/0370706

SUMMARY

An extreme ultraviolet light generation apparatus according to an aspect of the present disclosure is an apparatus to generate extreme ultraviolet light by irradiating a target with laser light, and includes a target supply unit configured to output the target, an actuator configured to shift a trajectory of the target, a first trajectory sensor configured to detect the trajectory of the target in a first direction, a second trajectory sensor configured to detect the trajectory of the target in a second direction being different from the first direction, and a control unit configured to perform trajectory control including controlling the actuator to cause the second trajectory sensor to be capable of detecting the trajectory of the target when the trajectory of the target has been detected by the first trajectory sensor and has not been detected by the second trajectory sensor.

A target control method according to an aspect of the present disclosure includes, in an extreme ultraviolet light generation apparatus configured to generate extreme ultraviolet light by irradiating a target with laser light, determining whether a trajectory of the target is detected by a first trajectory sensor and a second trajectory sensor, and performing trajectory control including controlling an actuator to cause the second trajectory sensor to be capable of detecting the trajectory of the target when the trajectory of the target has been detected by the first trajectory sensor and has not been detected by the second trajectory sensor. Here, the extreme ultraviolet light generation apparatus includes a target supply unit configured to output the target, the actuator configured to shift the trajectory of the target, the first trajectory sensor configured to detect the trajectory of the target in a first direction, and the second trajectory sensor configured to detect the trajectory of the target in a second direction being different from the first direction.

An electronic device manufacturing method according to an aspect of the present disclosure includes generating extreme ultraviolet light by irradiating a target with laser light in an extreme ultraviolet light generation apparatus, emitting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a target supply unit configured to output the target, an actuator configured to shift a trajectory of the target, a first trajectory sensor configured to detect the trajectory of the target in a first direction, a second trajectory sensor configured to detect the trajectory of the target in a second direction being different from the first direction, and a control unit configured to perform trajectory control including controlling the actuator to cause the second trajectory sensor to be capable of detecting the trajectory of the target when the trajectory of the target has been detected by the first trajectory sensor and has not been detected by the second trajectory sensor.

BRIEF DESCRIPTION OF THE DRAWINGS

Embodiments of the present disclosure will be described below merely as examples with reference to the accompanying drawings.

FIG. 3A shows an example of a beam profile in the vicinity of a light concentration position of illumination light 43 emitted from an illumination light laser device 41. FIG. 3B shows an example of a light intensity distribution extracted along the X-axis direction from a part of an image obtained by an X-axis trajectory sensor 4x. FIG. 3C shows an example of a light intensity distribution extracted along the Z-axis direction from a part of an image obtained by a Z-axis trajectory sensor 4z. FIG. 3D schematically shows arrangement of the X-axis trajectory sensor 4x, the Z-axis trajectory sensor 4z, and the illumination light laser device 41 as viewed in the +Y direction.

FIG. 4 is a flowchart showing operation of target control in a first embodiment of the present disclosure.

FIG. 5 is a flowchart showing details of trajectory control in the first embodiment.

FIGS. 6A and 6B each show an example of a light intensity distribution extracted along a first detection axis Aok from a part of an image obtained by the trajectory sensor detecting a trajectory T. FIG. 6C shows an example of a light intensity distribution extracted along a second detection axis Ang from a part of an image obtained by the trajectory sensor not detecting the trajectory T. FIG. 6D shows an example of an initial position PI on the second detection axis Ang. FIGS. 6E to 6H each show an example of the initial position PI and a command position PC on the second detection axis Ang. FIGS. 6I and 6J each show an example of a light intensity distribution extracted along the second detection axis Ang from a part of the image obtained by the trajectory sensor not detecting the trajectory T.

FIGS. 9F and 9G each show an example of a light intensity distribution extracted along the first detection axis Aok from a part of the image obtained by the trajectory sensor detecting the trajectory T. FIGS. 9H to 9K each show an example of the initial position PI and the command position PC on the second detection axis Ang.

DESCRIPTION OF EMBODIMENTS

Figure 1:
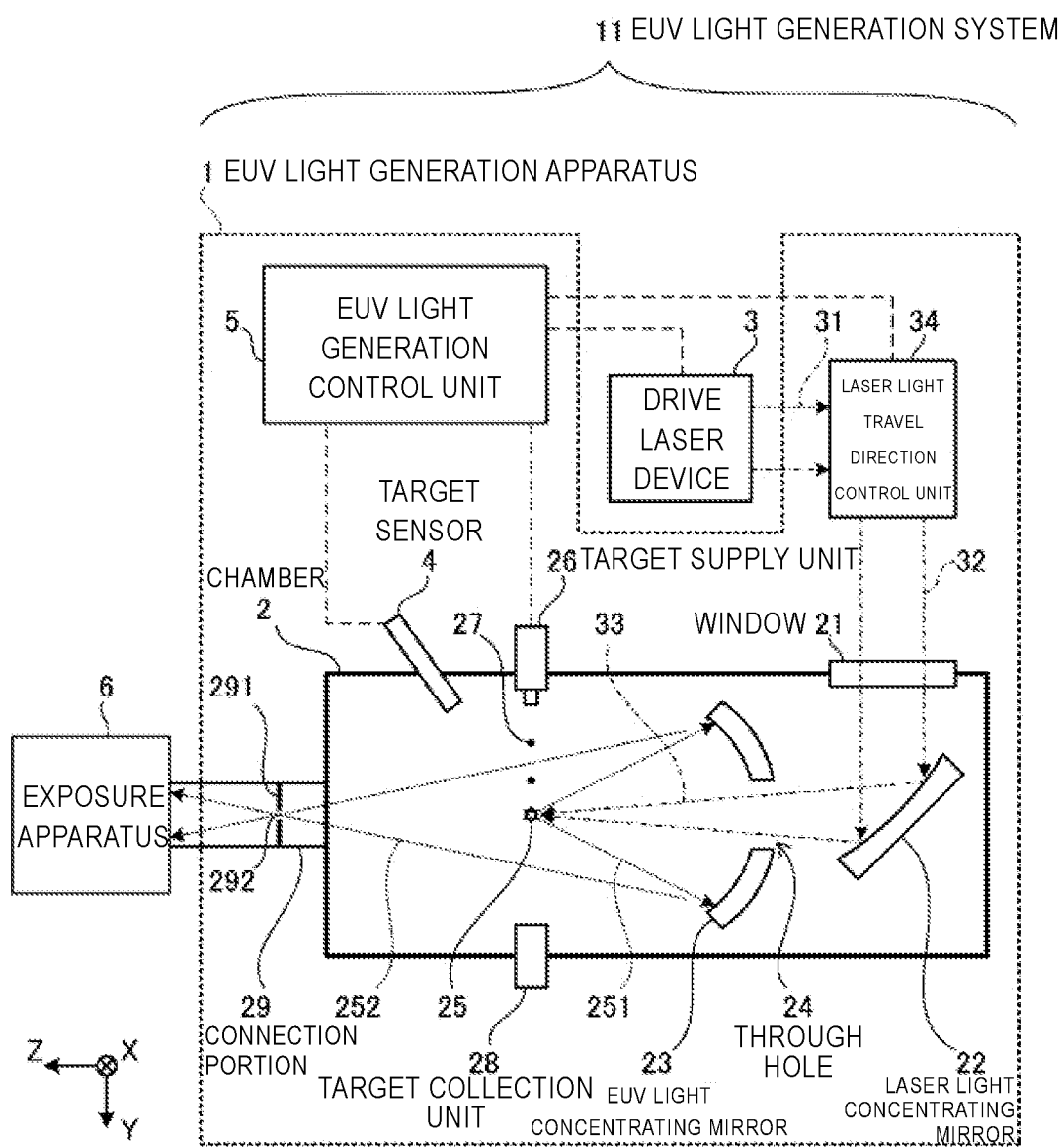
FIG. 1 schematically shows an exemplary configuration of an LPP EUV light generation system 11.

<Contents>
1. Overall description of EUV light generation system
 1.1 Configuration
 1.2 Operation
2. Comparative example
 2.1 Configuration
 2.2 Operation
 2.3 Problem
3. EUV light generation apparatus performing trajectory control when trajectory T is detected only on one detection axis
 3.1 Main flow
 3.2 Details of trajectory control
  3.2.1 Shift of trajectory T on first detection axis Aok
  3.2.2 Shift of trajectory T on second detection axis Ang
   3.2.2.1 First shift
   3.2.2.2 Second shift
   3.2.2.3 Third shift
   3.2.2.4 Fourth and subsequent shifts
  3.2.3 Case where trajectory T becomes capable of being detected on second detection axis Ang
 3.3 Effect
4. Trajectory control to determine trajectory shift direction
 4.1 Details of trajectory control
  4.1.1 Processing when number of trajectory shifts N is 0
  4.1.2 Processing when number of trajectory shifts N is 1
  4.1.3 Case where trajectory T becomes capable of being detected on second detection axis Ang
  4.1.4 Determination of shift direction D
  4.1.5 Shift of trajectory T on second detection axis Ang
   4.1.5.1 Processing of first round
   4.1.5.2 Processing of second and subsequent rounds
  4.1.6 Case where trajectory T becomes capable of being detected on second detection axis Ang
 4.2 Effect
5. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System 1.1 Configuration

FIG. 1 schematically shows an exemplary configuration of an LPP EUV light generation system 11. An EUV light generation apparatus 1 is used with at least one drive laser device 3. In the present application, a system including the EUV light generation apparatus 1 and the drive laser device 3 is referred to as the EUV light generation system 11. As shown in FIG. 1 and described in detail below, the EUV light generation apparatus 1 includes a chamber 2 and a target supply unit 26. The chamber 2 is configured sealable. The target supply unit 26 is attached, for example, to penetrate through a wall of the chamber 2. The material of the target substance output from the target supply unit 26 may include, but is not limited to, tin, terbium, gadolinium, lithium, xenon, or a combination of any two or more thereof.

At least one through hole is formed in a wall of the chamber 2. The through hole is provided with a window 21. Pulse laser light 32 emitted from the drive laser device 3 passes through the window 21. For example, an EUV light concentrating mirror 23 having a spheroidal reflection surface is arranged in the chamber 2. The EUV light concentrating mirror 23 has first and second focal points. A multilayer reflection film in which, for example, molybdenum and silicon are alternately stacked is formed on a surface of the EUV light concentrating mirror 23. The EUV light concentrating mirror 23 is arranged, for example, such that the first focal point is located in a plasma generation region 25 and the second focal point is located at an intermediate focal point (IF) 292. A through hole 24 is formed at the center of the EUV light concentrating mirror 23. Pulse laser light 33 passes through the through hole 24.

The EUV light generation apparatus 1 includes an EUV light generation control unit 5, a target sensor 4, and the like. The target sensor 4 has, for example, an imaging function, and detects the presence, trajectory, position, velocity, and the like of the target 27.

Further, the EUV light generation apparatus 1 includes a connection portion 29 providing communication between the internal space of the chamber 2 and the internal space of the exposure apparatus 6. A wall 291 in which an aperture is formed is arranged in the connection portion 29. The wall 291 is arranged such that the aperture is located at the second focal point of the EUV light concentrating mirror 23.

Further, the EUV light generation apparatus 1 includes a laser light travel direction control unit 34, a laser light concentrating mirror 22, a target collection unit 28 for collecting the target 27, and the like. The laser light travel direction control unit 34 includes an optical element for defining the travel direction of the laser light, and an actuator for adjusting the position, posture, and the like of the optical element.

1.2 Operation

Referring to FIG. 1, the pulse laser light 31 emitted from the drive laser device 3 passes through the window 21 through the laser light travel direction control unit 34 and enters the chamber 2 as the pulse laser light 32. The pulse laser light 32 travels along at least one laser light path in the chamber 2, is reflected by the laser light concentrating mirror 22, and is radiated to at least one target 27 as the pulse laser light 33.

The target supply unit 26 outputs the target 27 toward the plasma generation region 25 in the chamber 2. The target 27 is irradiated with at least one pulse included in the pulse laser light 33. The target 27 irradiated with the pulse laser light is turned into plasma, and radiation light 251 is radiated from the plasma. The EUV light concentrating mirror 23 reflects EUV light contained in the radiation light 251 at higher reflectance than light in other wavelength ranges. Reflection light 252 including the EUV light reflected by the EUV light concentrating mirror 23 is concentrated at the intermediate focal point 292 and output to the exposure apparatus 6. Here, one target 27 may be irradiated with a plurality of pulses included in the pulse laser light 33.

The EUV light generation control unit 5 controls the entire EUV light generation system 11. The EUV light generation control unit 5 processes image data or the like of the target 27 imaged by the target sensor 4. Further, the EUV light generation control unit 5 controls, for example, the timing at which the target 27 is output, the output direction of the target 27, and the like. Furthermore, the EUV light generation control unit 5 controls, for example, the oscillation timing of the drive laser device 3, the travel direction of the pulse laser light 32, the light concentration position of the pulse laser light 33, and the like. The above-described various kinds of control are merely examples, and other control may be added as necessary.

2. Comparative Example

2.1 Configuration

Figure 2:
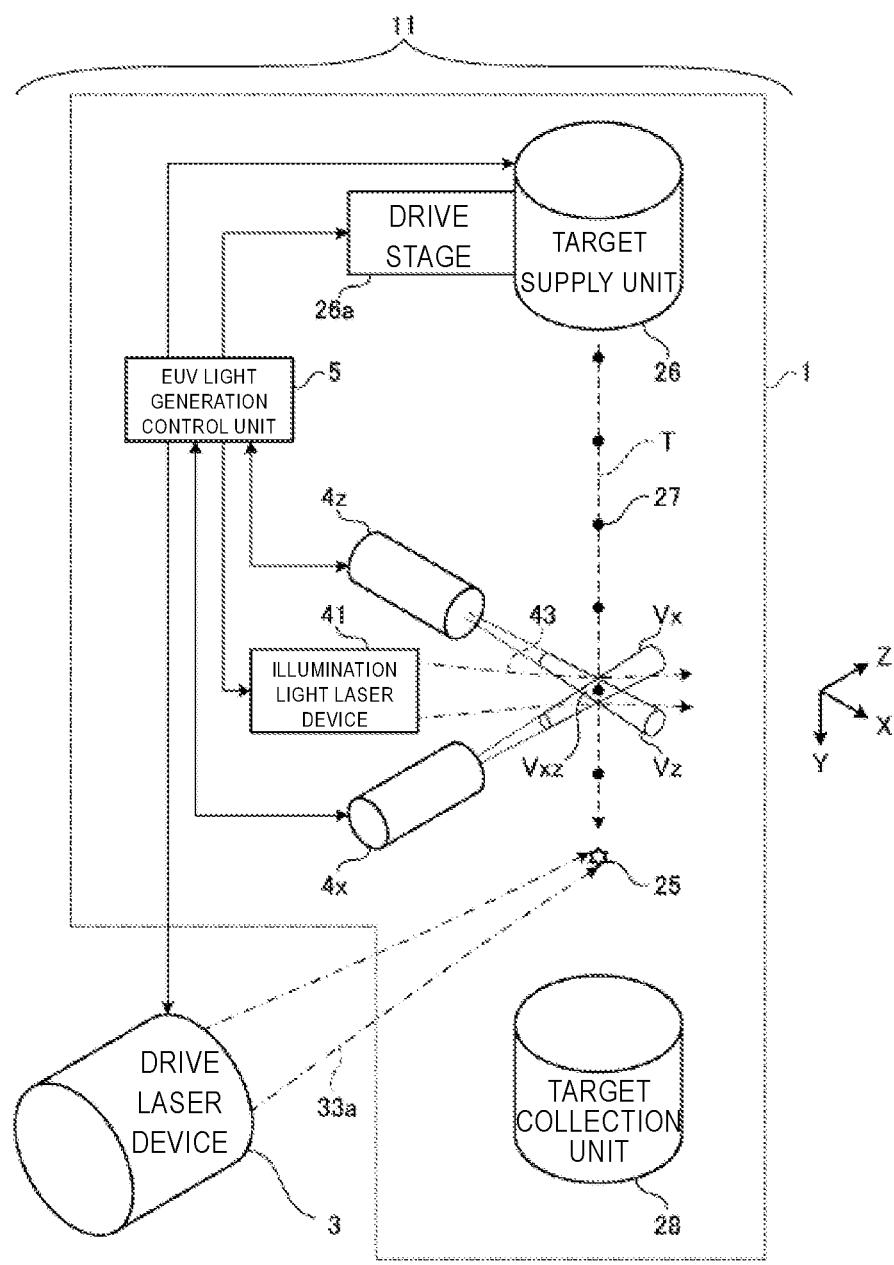
FIG. 2 schematically shows a part of the EUV light generation system 11 according to a comparative example.

FIG. 2 schematically shows a part of the EUV light generation system 11 according to a comparative example. In FIG. 2, the chamber 2, the laser light concentrating mirror 22, the EUV light concentrating mirror 23, the laser light travel direction control unit 34, and the like are omitted. As shown in FIG. 2, the EUV light generation apparatus 1 of the comparative example includes an X-axis trajectory sensor 4x, a Z-axis trajectory sensor 4z, an illumination light laser device 41, and a drive stage 26a.

The output direction of a plurality of the targets 27 output from the target supply unit 26 represents the +Y direction. The travel direction of laser light 33a radiated to the target 27 represents the +Z direction. The +Y direction and the +Z direction are perpendicular to each other. Directions perpendicular to both the +Y direction and the +Z direction represent the +X direction and the −X direction. Each of the plurality of targets 27 is in the form of a droplet. The laser light 33a is pulse laser light output from the drive laser device 3.

Each of the X-axis trajectory sensor 4x and the Z-axis trajectory sensor 4z includes, for example, an imaging device. Each of the X-axis trajectory sensor 4x and the Z-axis trajectory sensor 4z is configured to generate image data by imaging the target 27 moving toward the plasma generation region 25 from the target supply unit 26.

The X-axis trajectory sensor 4x is disposed at a position substantially in the −Z direction when viewed from a trajectory T of the target 27, and detects the trajectory T of the target 27 from the position in the −Z direction. When the position of the trajectory T of the target 27 is shifted in the +X direction or the −X direction, the position of the image of the target 27 in the image obtained by the X-axis trajectory sensor 4x moves in the +X direction or the −X direction. Therefore, the EUV light generation control unit 5 can calculate a detection position Pd on the X axis of the trajectory T of the target 27 based on the image data output from the X-axis trajectory sensor 4x. That is, the X-axis trajectory sensor 4x has a detection axis parallel to the X axis.

The Z-axis trajectory sensor 4z is disposed at a position substantially in the −X direction when viewed from the trajectory T of the target 27, and detects the trajectory T of the target 27 from the position in the −X direction. When the position of the trajectory T of the target 27 is shifted in the +Z direction or the −Z direction, the position of the image of the target 27 in the image obtained by the Z-axis trajectory sensor 4z moves in the +Z direction or the −Z direction. Therefore, the EUV light generation control unit 5 can calculate the detection position Pd on the Z axis of the trajectory T of the target 27 based on the image data output from the Z-axis trajectory sensor 4z. That is, the Z-axis trajectory sensor 4z has a detection axis parallel to the Z axis.

Each of the X-axis trajectory sensor 4x and the Z-axis trajectory sensor 4z is arranged to image the target 27 in the vicinity of the plasma generation region 25, for example, the target 27 just before reaching the plasma generation region 25. A detection range Vx of the X-axis trajectory sensor 4x and a detection range Vz of the Z-axis trajectory sensor 4z are defined by the angle of view and the depth of focus determined by the optical system of the sensors. The detection range Vx of the X-axis trajectory sensor 4x and the detection range Vz of the Z-axis trajectory sensor 4z overlap to each other at a space Vxz. Each of the X-axis trajectory sensor 4x and the Z-axis trajectory sensor 4z is aligned such that the ideal trajectory of the target 27 from the target supply unit 26 toward the plasma generation region 25 penetrates substantially the center of the space Vxz.

The illumination light laser device 41 is an illumination device for illuminating the target 27 with illumination light 43 being laser light. The space Vxz is included in the optical path of the illumination light 43.

The drive stage 26a is connected to the target supply unit 26. The drive stage 26a includes an actuator (not shown). The drive stage 26a is configured to shift the trajectory T of the target 27 by changing the position or posture of the target supply unit 26 with respect to the plasma generation region 25. For example, when the drive stage 26a is a two-axis stage, the drive stage 26a can shift the trajectory T of the target 27 in the X-axis direction and the Z-axis direction by moving the position of the target supply unit 26 in the X-axis direction and the Z-axis direction.

2.2 Operation

The illumination light laser device 41 generates the illumination light 43 under control of the EUV light generation control unit 5. When the target 27 passes through the space Vxz, the target 27 is illuminated with the illumination light 43.

Each of the X-axis trajectory sensor 4x and the Z-axis trajectory sensor 4z receives a part of the illumination light 43 reflected by the target 27. Each of the X-axis trajectory sensor 4x and the Z-axis trajectory sensor 4z images the target 27 illuminated by the illumination light 43 to generate image data, and outputs the image data to the EUV light generation control unit 5. The timing of the imaging by the X-axis trajectory sensor 4*x* and the Z-axis trajectory sensor 4*z* is controlled by the EUV light generation control unit 5.

The EUV light generation control unit 5 receives the image data from the X-axis trajectory sensor 4*x* and the Z-axis trajectory sensor 4*z*, and calculates the detection position Pd of the trajectory T of the target 27 in each of the X axis and the Z axis.

The EUV light generation control unit 5 controls the drive stage 26*a* based on the detection position Pd in each of the X axis and the Z axis and a target position Pt in each of the X axis and the Z axis. That is, the EUV light generation control unit 5 controls the drive stage 26*a* in the X-axis direction and the Z-axis direction so that the trajectory T of the target 27 approaches the target position Pt in each of the X axis and the Z axis. When the drive stage 26*a* changes the position or posture of the target supply unit 26, the trajectory T of the target 27 output thereafter is shifted. Thus, the trajectory T of the target 27 is adjusted so that the target 27 reaches the plasma generation region 25.

The drive laser device 3 may include a prepulse laser device and a main pulse laser device (not shown). Prepulse laser light emitted from the prepulse laser device is radiated to the target 27 and diffuse the target 27 to generate a diffusion target. Main pulse laser light emitted from the main pulse laser device is radiated to the diffusion target to turn the target substance contained in the diffusion target into plasma. One target 27 may be irradiated sequentially with a plurality of the prepulse laser light from a plurality of the prepulse laser devices (not shown).

The X-axis trajectory sensor 4*x* or the Z-axis trajectory sensor 4*z* outputs a passage timing signal indicating timing at which the target 27 passes through a predetermined position in the Y axis. The EUV light generation control unit 5 controls the drive laser device 3 so that the laser light 33*a* is emitted from the drive laser device 3 based on the passage timing signal. Further, the EUV light generation control unit 5 adjusts the light concentration position of the laser light 33*a* in the Y axis by controlling the actuator of the laser light travel direction control unit 34 based on the passage timing signal.

Further, the EUV light generation control unit 5 adjusts the light concentration position of the laser light 33*a* in the X axis by controlling the actuator of the laser light travel direction control unit 34 based on the detection position Pd of the trajectory T of the target 27 on the X axis.

2.3 Problem

FIG. 3A shows an example of a beam profile in the vicinity of the light concentration position of the illumination light 43 emitted from the illumination light laser device 41. The beam profile is a light intensity distribution in a cross section substantially perpendicular to the travel direction of the light. The vertical axis of FIG. 3A represents light intensity I. The illumination light 43 has a beam profile in a substantially Gaussian distribution.

The light concentration position of the illumination light 43 is adjusted to approximately coincide with the position of the space Vxz. The beam width WB at the light concentration position of the illumination light 43 is set such that the space Vxz is included in the optical path of the illumination light 43. Further, the light concentration position of the illumination light 43 is adjusted such that a position Ppeak of the peak of the light intensity distribution located at the center of the beam profile of the illumination light 43 coincides with a part of the ideal trajectory of the target 27 moving from the target supply unit 26 toward the plasma generation region 25. In this case, when the target 27 travels along the ideal trajectory, the target 27 is illuminated most brightly, and the contrast of the image obtained by each of the X-axis trajectory sensor 4*x* and the Z-axis trajectory sensor 4*z* is highest.

FIG. 3B shows an example of the light intensity distribution extracted along the X-axis direction from a part of an image obtained by an X-axis trajectory sensor 4*x*. The horizontal axis of FIG. 3B represents light intensity I. The dimension of the detection range Vx of the X-axis trajectory sensor 4*x* along the X-axis direction is indicated by $W_x$. As shown in FIG. 3B, when there is a steep peak in a part of the light intensity distribution, the peak is considered to be caused by the illumination light 43 reflected by the target 27. Therefore, the position of the peak can be set as the detection position Pd of the trajectory T of the target 27 on the X axis. For example, when the detection position Pd is deviated from the target position Pt in the +X direction, the trajectory T of the target 27 can be caused to approach to the target position Pt by controlling the drive stage 26*a* in the −X direction.

FIG. 3C shows an example of the light intensity distribution extracted along the Z-axis direction from a part of an image obtained by a Z-axis trajectory sensor 4*z*. The vertical axis of FIG. 3C represents the light intensity I. The dimension of the detection range Vz of the Z-axis trajectory sensor 4*z* along the Z-axis direction is indicated by $W_z$.

FIG. 3D schematically shows arrangement of the X-axis trajectory sensor 4*x*, the Z-axis trajectory sensor 4*z*, and the illumination light laser device 41 as viewed in the +Y direction. As described above, when the target 27 travels along the ideal trajectory, the target 27 passes through the space Vxz.

However, there may be a case that the target 27 does not pass through the space Vxz. For example, as shown in FIG. 3D, when the target 27 passes through a position outside the detection range Vz of the Z-axis trajectory sensor 4*z*, the image of the target 27 is not included in the image obtained by the Z-axis trajectory sensor 4*z*. Therefore, the light intensity distribution extracted along the Z-axis direction has no clear peak, as shown in FIG. 3C. In this case, the EUV light generation control unit 5 cannot calculate the detection position Pd of the trajectory T of the target 27 on the Z axis. In such a case, it is not clear whether the drive stage 26*a* should be controlled in the +Z direction or in the −Z direction.

As a countermeasure for a case where the trajectory T of the target 27 cannot be detected in one of the two detection axes, it is conceivable to determine the target supply unit 26 to be in an abnormal output state. In this case, the EUV light generation control unit 5 stops the control for the target supply unit 26 to output the target 27, and issues a trajectory detection error. The operator who recognizes the trajectory detection error readjusts the target supply unit 26 so that the target 27 is normally output. After the readjustment, a start-up process of the EUV light generation apparatus 1 is performed, and then the target 27 can be output. When the readjustment and start-up process described above are required, the operation time of the EUV light generation apparatus 1 is shortened, and the productivity is decreased.

Even when the trajectory T cannot be detected in one of the two detection axes, the trajectory T may be detected in the other detection axis. For example, when the following two conditions are satisfied, the trajectory T of the target 27 in the X-axis direction can be detected.

(1) The trajectory T is included in the detection range Vx of the X-axis trajectory sensor 4*x*, and (2) The trajectory T is included in the optical path of the illumination light 43.

Even when the trajectory T cannot be detected in one of the two detection axes, if the trajectory T is detected in the other detection axis, it is understood that at least outputting of the target 27 has been performed. In the embodiments described below, trajectory control is performed under conditions that the trajectory T is detected by one trajectory sensor and the trajectory T is not detected by the other trajectory sensor. Thus, there is a possibility that the EUV light generation apparatus 1 can be operated without readjustment and the start-up process by an operator.

3. EUV Light Generation Apparatus Performing Trajectory Control when Trajectory T is Detected Only on One Detection Axis 3.1 Main flow FIG. 4 is a flowchart showing operation of target control in a first embodiment of the present disclosure. The structural configuration of the EUV light generation apparatus 1 according to the first embodiment is the same as the configuration of the comparative example described referring to FIGS. 2 and 3A to 3D.

The target control shown in FIG. 4 is performed by the EUV light generation control unit 5. The target control shown in FIG. 4 is performed, for example, immediately after the start of the operation of the target supply unit 26. For example, when the target substance contains tin, the target control shown in FIG. 4 is performed immediately after the inside of the container of molten tin is pressurized and outputting of the target 27 is started.

First, in S10, the EUV light generation control unit 5 determines whether the trajectory T is detected on both the two detection axes. When the trajectory T of the target 27 is detected by both the X-axis trajectory sensor 4x and the Z-axis trajectory sensor 4z (S10: YES), the EUV light generation control unit 5 advances processing to S80. When the trajectory T of the target 27 is not detected by at least one of the X-axis trajectory sensor 4x and the Z-axis trajectory sensor 4z (S10: NO), the EUV light generation control unit 5 advances processing to S20.

In S20, the EUV light generation control unit 5 determines whether the trajectory T is detected on either one of the detection axes.

When the trajectory T is not detected on any of the detection axes (S20: NO), that is, when the trajectory T of the target 27 is not detected by any of the X-axis trajectory sensor 4x and the Z-axis trajectory sensor 4z, the EUV light generation control unit 5 advances processing to S90.

When the trajectory T is detected on either one of the detection axes (S20: YES), that is, when the trajectory T of the target 27 is detected by either one of the trajectory sensors and is not detected by the other trajectory sensor, the EUV light generation control unit 5 advances processing to S30. In the following, the detection axis on which the trajectory T is detected is referred to as a first detection axis Aok. In the following, the detection axis on which the trajectory T is not detected is referred to as a second detection axis Ang. One of the X axis and the Z axis corresponds to the first detection axis Aok, and the other thereof corresponds to the second detection axis Ang. In the examples shown in FIGS. 3A to 3D, the X axis corresponds to the first detection axis Aok on which the trajectory T is detected, and the Z axis corresponds to the second detection axis Ang on which the trajectory T is not detected. Also, one of the X-axis trajectory sensor 4x and the Z-axis trajectory sensor 4z corresponds to a first trajectory sensor in the present disclosure, and the other thereof corresponds to the second trajectory sensor in the present disclosure. In the examples shown in FIGS. 3A to 3D, the X-axis trajectory sensor 4x detecting the trajectory T corresponds to the first trajectory sensor in the present disclosure, and the Z-axis trajectory sensor 4z not detecting the trajectory T corresponds to the second trajectory sensor in the present disclosure. The −Z direction in which the X-axis trajectory sensor 4x detecting the trajectory T is located corresponds to the first direction in the present disclosure, and the −X direction in which the Z-axis trajectory sensor 4z not detecting the trajectory T is located corresponds to the second direction in the present disclosure.

In S30, the EUV light generation control unit 5 performs the trajectory control so that the trajectory T can be detected not only on the first detection axis Aok on which the trajectory T is detected but also on the second detection axis Ang on which the trajectory T has not been detected. The trajectory control includes controlling the drive stage 26a to shift the position of the trajectory T on the second detection axis Ang and determining whether the trajectory T becomes capable of being detected on the second detection axis Ang. Details of the trajectory control will be described later with reference to FIGS. 5 and 6A to 6J. After S30, the EUV light generation control unit 5 advances processing to S70.

In S70, the EUV light generation control unit 5 determines whether the trajectory T is detected on both the two detection axes. This process is similar to S10. When the trajectory T becomes capable of being detected on both the two detection axes after the trajectory control is performed (S70: YES), the EUV light generation control unit 5 advances processing to S80. When the trajectory T remains incapable of being detected on at least one detection axis even after the trajectory control is performed, (S70: NO), the EUV light generation control unit 5 advances processing to S90.

In S80, the EUV light generation control unit 5 determines the target supply unit 26 to be in a normal output state. In this case, the EUV light generation control unit 5 causes the target supply unit 26 to continue outputting the target 27. Further, the EUV light generation control unit 5 starts trajectory adjustment based on the trajectory T of the target 27 detected on each of the two detection axes. That is, as described in the comparative example, the EUV light generation control unit 5 controls the drive stage 26a so that the trajectory T of the target 27 detected by the X-axis trajectory sensor 4x and the trajectory T of the target 27 detected by the Z-axis trajectory sensor 4z approach the respective target positions Pt. After S80, the EUV light generation control unit 5 ends the target control of the present flowchart. The output and the trajectory adjustment of the targets 27 are continued thereafter.

In S90, the EUV light generation control unit 5 determines the target supply unit 26 to be in an abnormal output state. In this case, the EUV light generation control unit 5 stops outputting the target 27 by the target supply unit 26, and issues a signal indicating a trajectory detection error. After S90, the EUV light generation control unit 5 ends the target control of the present flowchart.

The reason why the abnormal discharge state is determined when processing proceeds from S20 to S90 is as follows. When the trajectory T is not detected on any of the detection axes, it is the case that the target 27 is not output or the trajectory T of the target 27 is significantly deviated from the plasma generation region 25. When the target 27 is not output, it is necessary to stop the EUV light generation apparatus 1 to repair or replace the target supply unit 26. On the other hand, when the trajectory T of the target 27 is significantly deviated from the plasma generation region 25, there is a possibility that the trajectory T of the target 27 is deviated to a position where the target 27 cannot be collected by the target collection unit 28. In this case, it is necessary to stop the EUV light generation apparatus 1 to prevent the optical components in the EUV light generation apparatus 1 from being contaminated with the target substance.

Further, it is also determined to be the abnormal output state when processing proceeds from S70 to S90. As will be described later, in the trajectory control, the trajectory T of the target 27 is gradually shifted larger. When the trajectory T of the target 27 is significantly deviated, there is a possibility that the trajectory T of the target 27 is deviated to a position where the target 27 cannot be collected by the target collection unit 28. When the trajectory T of the target 27 remains incapable of being detected even after the trajectory control is performed, it is necessary to stop the EUV light generation apparatus 1 to prevent the optical components in the EUV light generation apparatus 1 from being contaminated with the target substance.

3.2 Details of Trajectory Control

FIG. 5 is a flowchart showing details of the trajectory control in the first embodiment. The processing shown in FIG. 5 corresponds to the subroutine of S30 in FIG. 4.

FIGS. 6A and 6B each show an example of the light intensity distribution extracted along the first detection axis Aok from a part of an image obtained by the trajectory sensor detecting the trajectory T.

Each of FIGS. 6C, 6I, and 6J shows an example of the light intensity distribution extracted along the second detection axis Ang from a part of the image obtained by the trajectory sensor not detecting the trajectory T.

FIG. 6D shows an example of an initial position PI on the second detection axis Ang.

Each of FIGS. 6E to 6H shows an example of the initial position PI and a command position PC on the second detection axis Ang.

3.2.1 Shift of Trajectory T on First Detection Axis Aok

First, in S31, the EUV light generation control unit 5 sets the number of trajectory shifts N to an initial value of 0.

Next, in S32, the EUV light generation control unit 5 sets the command position PC on the first detection axis Aok on which the trajectory T is detected by following Equation (1).

$$PC=PP-Pd+Pt \quad (1)$$

In Equation (1), the command position PC is a command position for the EUV light generation control unit 5 to control the drive stage 26a. PP represents the current position of the drive stage 26a. The command position PC and the current position PP have values defined in the coordinate system of the drive stage 26a. That is, the current position PP specifies where the drive stage 26a is located in its movable range. The command position PC specifies to which position in the movable range the drive stage 26a is to be controlled.

In Equation (1), Pd represents the detection position of the trajectory T of the target 27 detected by the X-axis trajectory sensor 4x or the Z-axis trajectory sensor 4z. Pt represents the target position of the trajectory T of the target 27. The detection position Pd and the target position Pt have values defined in the coordinate system of the X-axis trajectory sensor 4x or the Z-axis trajectory sensor 4z. That is, the detection position Pd is specified from the image obtained by the X-axis trajectory sensor 4x or the Z-axis trajectory sensor 4z. The X-axis trajectory sensor 4x and the Z-axis trajectory sensor 4z are aligned, for example, such that the center position of each detection range coincides with the target position Pt.

The coordinate system of the drive stage 26a does not necessarily coincide with the coordinate system of the X-axis trajectory sensor 4x or the Z-axis trajectory sensor 4z. For example, even when the command position PC is set at the center position of the movable range of the drive stage 26a, the trajectory T of the target 27 does not necessarily pass through the center position of the detection range of the X-axis trajectory sensor 4x or the Z-axis trajectory sensor 4z.

Here, the coordinate system of the drive stage 26a is set to have the same scale as the coordinate system of the X-axis trajectory sensor 4x and the Z-axis trajectory sensor 4z.

In FIG. 6A, an example of the detection position Pd and the target position Pt on the first detection axis Aok is shown. The command position PC for causing the trajectory T of the target 27 to approach to the target position Pt is calculated by adding the difference between the target position Pt and the detection position Pd to the current position PP of the drive stage 26a.

Here, it is possible to define the command position PC, the current position PP, the detection position Pd, and the target position Pt respectively on the first detection axis Aok and the second detection axis Ang. In Equation (1), the command position PC, the current position PP, the detection position Pd, and the target position Pt have values defined on the first detection axis Aok.

Next, in S33, the EUV light generation control unit 5 controls the drive stage 26a in accordance with the set command position PC. When processing proceeds from S32 to S33, since the command position PC on the first detection axis Aok is set, in S33, the drive stage 26a is controlled in the direction along the first detection axis Aok.

FIG. 6B shows an example of the light intensity distribution after the drive stage 26a is controlled along the first detection axis Aok. As described above, the position Ppeak of the peak of the light intensity distribution of the illumination light 43 coincides with a part of the ideal trajectory of the target 27. Therefore, when the drive stage 26a is controlled in S32 and S33 so that the trajectory T of the target 27 detected on the first detection axis Aok approaches the target position Pt, the target 27 is brightly illuminated in the subsequent process. Then, the contrast of the images obtained by the X-axis trajectory sensor 4x and the Z-axis trajectory sensor 4z increases. This makes it possible to more accurately detect the trajectory T of the target 27.

Next, in S34, the EUV light generation control unit 5 determines whether the trajectory T remains capable of being detected on the first detection axis Aok on which the trajectory T has been detected.

When the trajectory T becomes incapable ob being detected on the first detection axis Aok due to the control of the drive stage 26a in S33 (S34: NO), the EUV light generation control unit 5 ends the processing of the present flowchart and returns processing to the main flow shown in FIG. 4. In this case, it is determined as NO in S70 in FIG. 4.

When the trajectory T can still be detected on the first detection axis Aok (S34: YES), the EUV light generation control unit 5 advances processing to S35.

In S35, the EUV light generation control unit 5 determines whether the trajectory T becomes capable of being detected on the second detection axis Ang on which the trajectory T has not been detected.

When the trajectory T becomes capable of being detected on the second detection axis Ang due to the control of the drive stage 26a in S33 (S35: YES), the EUV light generation control unit 5 advances processing to S40.

When the trajectory T remains incapable of being detected on the second detection axis Ang (S35: NO), the EUV light generation control unit 5 advances processing to S37. FIG. 6C shows an example of the light intensity distribution extracted along the second detection axis Ang. The trajectory T cannot be detected from such light intensity distribution having no clear peak.

In S37, the EUV light generation control unit 5 determines whether the number of trajectory shifts N is less than an upper limit Nmax.

When the number of trajectory shifts N reaches the upper limit Nmax (S37: NO), the EUV light generation control unit 5 ends the processing of the present flowchart, and returns processing to the main flow shown in FIG. 4. In this case, it is determined as NO in S70 in FIG. 4.

When the number of trajectory shifts N is less than the upper limit Nmax (S37: YES), the EUV light generation control unit 5 advances processing to S38.

3.2.2 Shift of Trajectory T on Second Detection Axis Ang
3.2.2.1 First Shift

In S38, the EUV light generation control unit 5 sets the command position PC on the second detection axis Ang on which the trajectory T is not detected by following Equation (2).

$$PC = PI + (-1)^N \cdot \text{int}((N+1)/2) \cdot W \quad (2)$$

Here, int(A) represents an integer obtained by rounding up a fraction below the decimal point of the positive number A.

In Equation (2), PI represents the initial position of the drive stage 26a on the second detection axis Ang. The initial position PI has a value defined in the coordinate system of the drive stage 26a. It is preferable that, before controlling the drive stage 26a in the trajectory control, the EUV light generation control unit 5 obtains data of the current position PP of the drive stage 26a and stores the obtained data as the initial position PI in a memory device (not shown). The initial position PI corresponds to the predetermined position in the present disclosure.

In Equation (2), W represents a shift width indicating an amount of shifting the position of the trajectory T along the second detection axis Ang in the trajectory control. The shift width W is a positive number. If the shift width W is set too large, there is a possibility that the trajectory T passes through the space Vxz when the position of the trajectory T is shifted on the second detection axis Ang. It is preferable that the shift width W is, for example, equal to or less than the half of the dimension $W_z$ or $W_x$, along the second detection axis Ang, of the detection range Vz or Vx of the trajectory sensor not detecting the trajectory T. On the other hand, if the shift width W is too small, there is a possibility that the trajectory T cannot reach the space Vxz unless the command position PC is updated many times in the processing of FIG. 5. The shift width W is, for example, 300 μm or more and 1500 μm or less. The shift width W is preferably 500 μm. The shift width W in the first embodiment corresponds to each of the first distance and the second distance in the present disclosure.

In S38, when the number of trajectory shifts N is set to 0 (N=0), the command position PC on the second detection axis Ang is set as follows according to Equation (2).

$$PC = PI + W$$

FIG. 6D shows an example of the initial position PI on the second detection axis Ang. FIG. 6E shows an example of the initial position PI on the second detection axis Ang and the command position PC when the number of trajectory shifts N is set to 0. The command position PC is obtained by adding the shift width W to the initial position PI. The positive direction of the second detection axis Ang corresponds to the third direction in the present disclosure. For example, when the Z axis is the second detection axis Ang, the +Z direction corresponds to the third direction in the present disclosure. The command position PC obtained by adding the shift width W to the initial position PI corresponds to the first position in the present disclosure. After S38, the EUV light generation control unit 5 advances processing to S39.

In S39, the EUV light generation control unit 5 updates the number of trajectory shifts N by adding 1 to the value of N. After S39, the EUV light generation control unit 5 advances processing to S33.

When processing proceeds from S39 to S33, since the command position PC on the second detection axis Ang is set, in S33, the drive stage 26a is controlled in the direction along the second detection axis Ang. The subsequent processes of S34 to S37 are as described above. As described above, in S35, the EUV light generation control unit 5 determines whether the trajectory T becomes capable of being detected on the second detection axis Ang on which the trajectory T has not been detected. The processing of shifting the trajectory T of the target 27 to the first position in the present disclosure and determining whether the trajectory T becomes capable of being detected on the second detection axis Ang in S35 corresponds to the first processing in the present disclosure.

3.2.2.2 Second Shift

In S38, when the number of trajectory shifts N is set to 1 (N=1), the command position PC on the second detection axis Ang is set as follows according to Equation (2).

$$PC = PI - W$$

FIG. 6F shows an example of the initial position PI on the second detection axis Ang and the command position PC when the number of trajectory shifts N is set to 1. The command position PC is obtained by subtracting the shift width W from the initial position PI. The negative direction of the second detection axis Ang corresponds to the fourth direction in the present disclosure. For example, when the Z axis is the second detection axis Ang, the −Z direction corresponds to the fourth direction in the present disclosure. The command position PC obtained by subtracting the shift width W from the initial position PI corresponds to the second position in the present disclosure. Thereafter, processing proceeds from S39 to S33, and the processes of S34 to S37 are performed as described above. The processing of shifting the trajectory T of the target 27 to the second position and determining whether the trajectory T becomes capable of being detected on the second detection axis Ang in S35 corresponds to the second processing in the present disclosure.

3.2.2.3 Third Shift

In S38, when the number of trajectory shifts N is set to 2 (N=2), the command position PC on the second detection axis Ang is set as follows according to Equation (2).

$$PC = PI + 2 \cdot W$$

FIG. 6G shows an example of the initial position PI on the second detection axis Ang and the command position PC when the number of trajectory shifts N is set to 2. The command position PC is obtained by adding twice the shift width W to the initial position PI. Twice the shift width W corresponds to each of the third distance and the fourth distance in the present disclosure, and the command position PC obtained by adding twice the shift width W to the initial position PI corresponds to the third position in the present disclosure. Thereafter, processing proceeds from S39 to S33, and the processes of S34 to S37 are performed as described above. The processing of shifting the trajectory T of the target 27 to the third position in the present disclosure and determining whether the trajectory T becomes capable of being detected on the second detection axis Ang in S35 corresponds to the third processing in the present disclosure.

3.2.2.4 Fourth and Subsequent Shifts

In S38, when the number of trajectory shifts N is set to 3 (N=3), the command position PC on the second detection axis Ang is set as follows according to Equation (2).

$$PC=PI-2\cdot W$$

FIG. 6H shows an example of the initial position PI on the second detection axis Ang and the command position PC when the number of trajectory shifts N is set to 3. The command position PC is obtained by subtracting twice the shift width W from the initial position PI. The command position PC obtained by subtracting twice the shift width W from the initial position PI corresponds to the fourth position in the present disclosure. Thereafter, processing proceeds from S39 to S33, and the processes of S34 to S37 are performed as described above. The processing of shifting the trajectory T of the target 27 to the fourth position in the present disclosure and determining whether the trajectory T becomes capable of being detected on the second detection axis Ang in S35 corresponds to the fourth processing in the present disclosure.

In this way, the direction into which the position of the trajectory T is shifted with respect to the initial position PI is switched between the positive and negative directions of the second detection axis Ang every time 1 is added to the value of the number of trajectory shifts N in S39. The distance from the initial position PI is gradually increased. Every time the position of the trajectory T is shifted, it is determined in S35 whether the trajectory T becomes capable of being detected on the second detection axis Ang. When the trajectory T becomes capable of being detected on the second detection axis Ang, processing proceeds to S40 as described above.

3.2.3 Case where Trajectory T Becomes Capable of being Detected on Second Detection Axis Ang In S40, the EUV light generation control unit 5 sets the command position PC on the second detection axis Ang on which the trajectory T becomes newly capable of being detected by following Equation (3).

$$PC=PP-Pd+Pt \quad (3)$$

Equation (3) is similar to Equation (1). In Equation (3), the command position PC, the current position PP, the detection position Pd, and the target position Pt have values defined on the second detection axis Ang.

FIG. 6I shows an example of the detection position PD and the target position Pt on the second detection axis Ang on which the trajectory T becomes newly capable of being detected. The command position PC for causing the trajectory T of the target 27 to be approach to the target position Pt is calculated by adding the difference between the target position Pt and the detection position Pd to the current position PP of the drive stage 26a.

Next, in S41, the EUV light generation control unit 5 controls the drive stage 26a in accordance with the set command position PC. In S41, the drive stage 26a is controlled along the second detection axis Ang on which the trajectory T becomes newly capable of being detected.

FIG. 6J shows an example of the light intensity distribution after the drive stage 26a is controlled along the second detection axis Ang.

After S41, the EUV light generation control unit 5 ends the processing of the present flowchart and returns to the main flow shown in FIG. 4. In this case, it is determined as YES in S70 in FIG. 4.

In other respects, the operation of the first embodiment is similar to that of the comparative example.

3.3 Effect

According to the first embodiment, the trajectory control is performed under conditions that the trajectory T is detected by one of the X-axis trajectory sensor 4x and the Z-axis trajectory sensor 4z and the trajectory T is not detected by the other trajectory sensor. Thus, the EUV light generation apparatus 1 can be operated without the readjustment and start-up process by an operator.

According to the first embodiment, the direction into which the position of the trajectory T is shifted with respect to the initial position PI is switched between the positive direction and the negative direction of the second detection axis Ang. Further, the distance from the initial position PI is gradually increased. Every time the position of the trajectory T is shifted, it is determined whether the trajectory T becomes capable of being detected on the second detection axis Ang. Therefore, the trajectory T can be automatically moved to the space Vxz even when the space Vxz which can be imaged by both the X-axis trajectory sensor 4x and the Z-axis trajectory sensor 4z is positioned in the positive direction or the negative direction with respect to the initial position PI.

Figure 7:
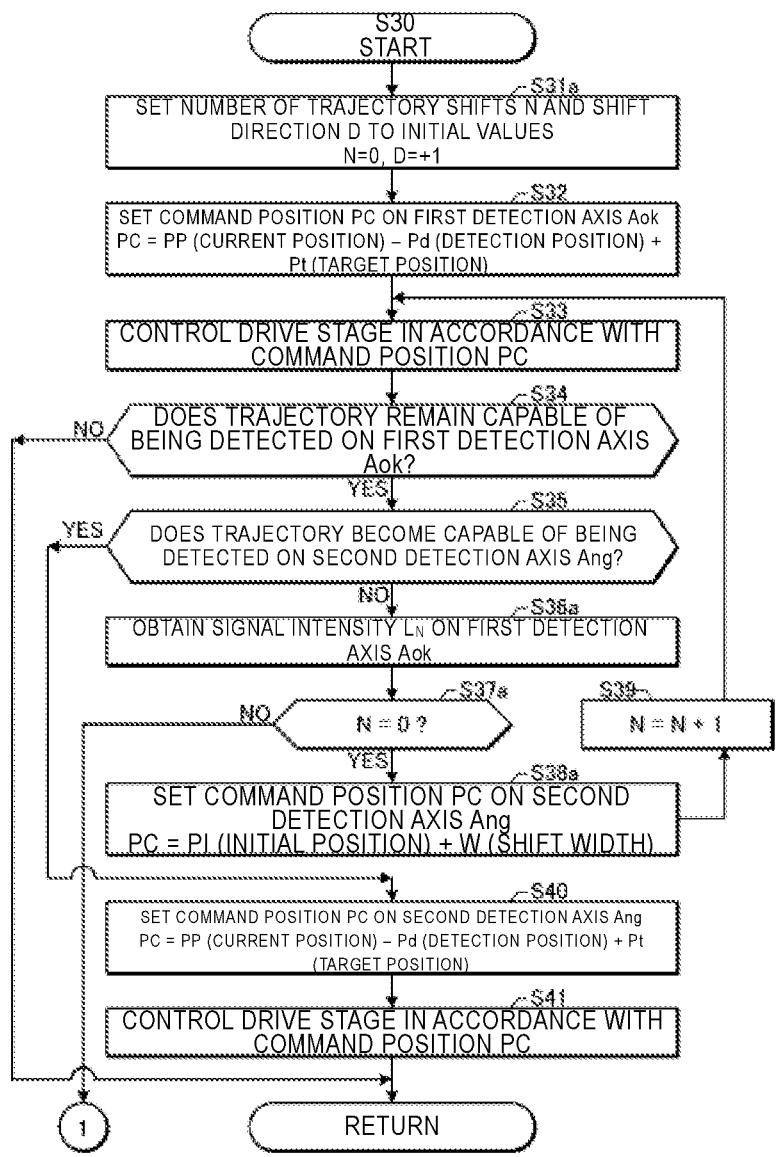
FIG. 7 is a flowchart showing details of trajectory control in the second embodiment.
Figure 8:
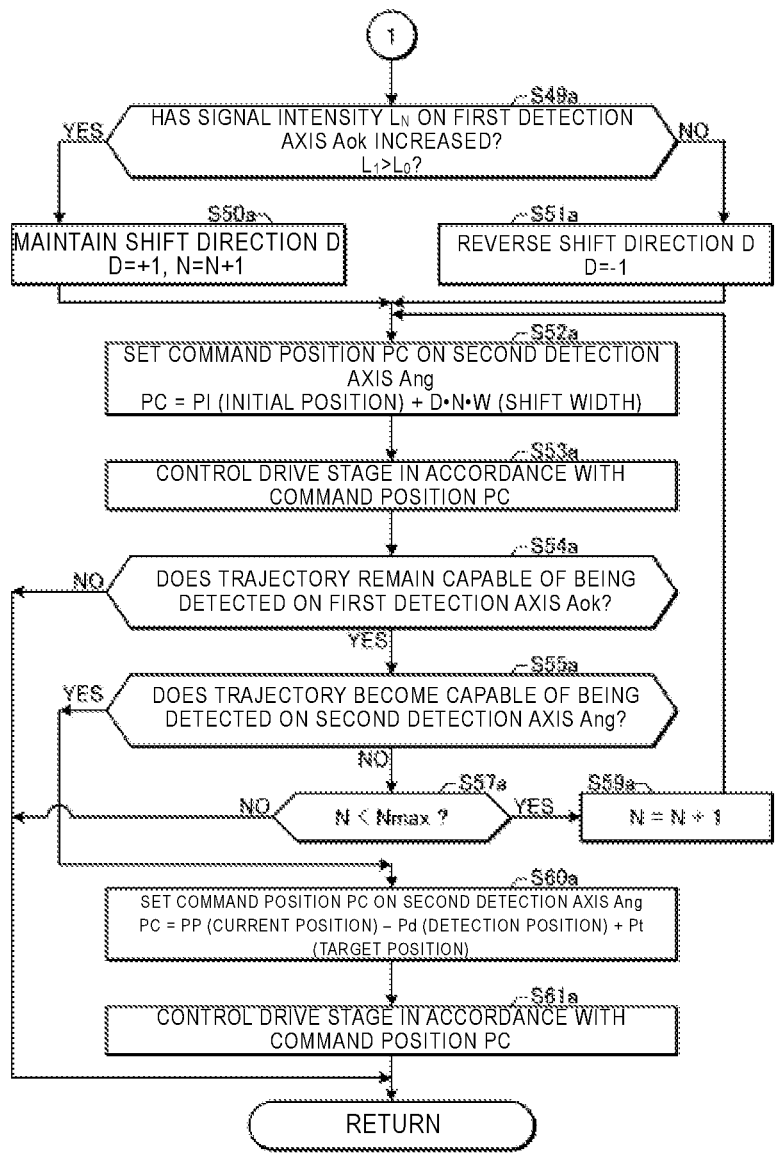
FIG. 8 is a flowchart showing details of trajectory control in the second embodiment.

4. Trajectory Control to Determine Trajectory Shift Direction 4.1 Details of Trajectory Control FIGS. 7 and 8 are flowcharts showing details of the trajectory control in the second embodiment. The processing shown in FIGS. 7 and 8 corresponds to the subroutine of S30 in FIG. 4. The structural configuration of the EUV light generation apparatus 1 according to the second embodiment is similar to the configuration of the comparative example described with reference to FIGS. 2 and 3A to 3D. The main flow in the second embodiment is similar to the main flow in the first embodiment described with reference to FIG. 4.

Each of FIGS. 9A, 9B, 9F, and 9G shows an example of the light intensity distribution extracted along the first detection axis Aok from a part of an image obtained by the trajectory sensor detecting the trajectory T.

Figure 9A:
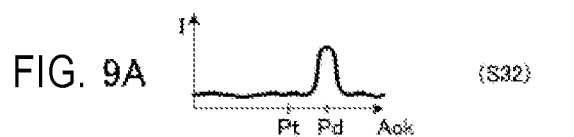
FIGS. 9A and 9B each show an example of a light intensity distribution extracted along the first detection axis Aok from a part of the image obtained by the trajectory sensor detecting the trajectory T.
Figure 9B:
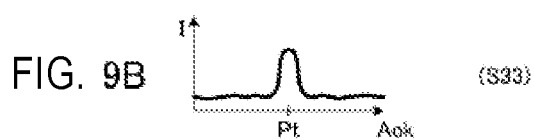
Figure 9C:
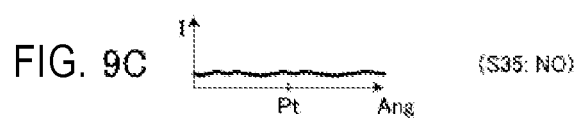
FIG. 9C shows an example of a light intensity distribution extracted along the second detection axis Ang from a part of the image obtained by the trajectory sensor not detecting the trajectory T.

FIG. 9C shows an example of the light intensity distribution extracted along the second detection axis Ang from a part of the image obtained by the trajectory sensor not detecting the trajectory T.

Figure 9D:
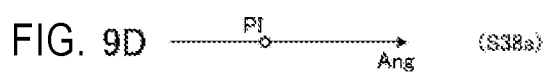
FIG. 9D shows an example of the initial position PI on the second detection axis Ang.

FIG. 9D shows an example of the initial position PI on the second detection axis Ang.

Each of FIGS. 9E and 9H to 9K shows an example of the initial position PI and the command position PC on the second detection axis Ang.

4.1.1 Processing when Number of Trajectory Shifts N is 0

First, in S31a of FIG. 7, the EUV light generation control unit 5 sets the number of trajectory shifts N and the shift direction D to the initial values, respectively. The initial value of the number of trajectory shifts N is 0, and the initial value of the shift direction D is +1.

The subsequent processes of S32 to S35 are similar to those of the first embodiment described with reference to FIG. 5. The light intensity distributions of FIGS. 9A to 9C are similar to the light intensity distributions of FIGS. 6A to 6C in the first embodiment. When the trajectory T remains incapable of being detected on the second detection axis Ang (S35: NO), the EUV light generation control unit 5 advances processing to S36a.

In S36a, the EUV light generation control unit 5 obtains signal intensity $L_N$ on the first detection axis Aok. The signal intensity $L_N$ on the first detection axis Aok is, for example, the brightness at the position of the peak of the light intensity distribution extracted along the first detection axis Aok on which the trajectory T is detected. When the number of trajectory shifts N is set to 0 (N=0), the EUV light generation control unit 5 obtains the signal intensity $L_0$ on the first detection axis Aok. The signal intensity $L_0$ is, for example, the brightness at the position of the peak of the light intensity distribution as shown in FIG. 9B.

Next, in S37a, the EUV light generation control unit 5 determines whether the number of trajectory shifts N is set to 0. Only when the number of trajectory shifts N is set to 0 (S37a: YES), the EUV light generation control unit 5 advances processing to S38a. When the number of trajectory shifts N is not 0 (S37a: NO), the EUV light generation control unit 5 advances processing to S49a of FIG. 8

In S38a, the EUV light generation control unit 5 sets the command position PC on the second detection axis Ang on which the trajectory T is not detected by following Equation (4).

$$PC=PI+W \quad (4)$$

Figure 9E:
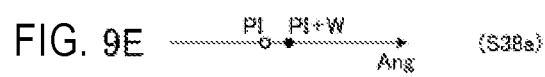
FIG. 9E shows an example of the initial position PI and the command position PC on the second detection axis Ang.

FIG. 9D shows an example of the initial position PI on the second detection axis Ang. FIG. 9E shows an example of the initial position PI on the second detection axis Ang and the command position PC set in S38a. The command position PC is obtained by adding the shift width W to the initial position PI. The command position PC obtained by adding the shift width W to the initial position PI corresponds to the fifth position in the present disclosure.

4.1.2 Processing when Number of Trajectory Shifts N is 1

In S39 after S38a, the EUV light generation control unit 5 updates the number of trajectory shifts N by adding 1 to the value of N. After S39, the EUV light generation control unit 5 advances processing to S33.

When processing proceeds from S39 to S33, in S33, the drive stage 26a is controlled in the direction along the second detection axis Ang on which the trajectory T is detected. The subsequent processes of S34 and S35 are as described above. As described above, in S35, the EUV light generation control unit 5 determines whether the trajectory T becomes capable of being detected on the second detection axis Ang on which the trajectory T has not been detected. The processing of shifting the trajectory T of the target 27 to the fifth position in the present disclosure in S38a and S33 and determining whether the trajectory T becomes capable of being detected on the second detection axis Ang in S35 corresponds to the fifth processing in the present disclosure.

In S36a, when the number of trajectory shifts N is set to 1 (N=1), the EUV light generation control unit 5 obtains the signal intensity $L_1$ on the first detection axis Aok. The signal intensity $L_1$ is, for example, the brightness at the position of the peak of the light intensity distribution as shown in FIG. 9F or 9G. Next, in S37a, since the number of trajectory shifts N is determined not to be 0 (S37a: NO), the EUV light generation control unit 5, advances processing to S49a of FIG. 8.

4.1.3 Case where Trajectory T Becomes Capable of being Detected on Second Detection Axis Ang The processes of S40 and S41 when it is determined YES in S35 is similar to those of S40 and S41 in the first embodiment described with reference to FIG. 5, respectively.

4.1.4 Determination of Shift Direction D

In S49a of FIG. 8, the EUV light generation control unit 5 determines whether the signal intensity $L_N$ on the first detection axis Aok is increased. In the processing of FIG. 7 described above, the signal intensity $L_0$ when the number of trajectory shifts N is set to 0 and the signal intensity $L_1$ when the number of trajectory shifts N is set to 1 are obtained as the signal intensity $L_N$. Then, the EUV light generation control unit 5 compares the signal intensity $L_0$ with the signal intensity $L_1$. The processing of determining the change in the signal intensity $L_N$ due to controlling the drive stage 26a in S38a and S33 corresponds to the sixth processing in the present disclosure.

As can be seen from a comparison between FIG. 9B and FIG. 9F, the brightness at the position of the peak of the light intensity distribution along the first detection axis Aok may be increased by controlling the drive stage 26a along the second detection axis Ang in S38a and S33. As described with reference to FIGS. 3A to 3D, the light concentration position of the illumination light 43 is adjusted such that the peak position Ppeak of the light intensity distribution located at the center of the beam profile coincides with a part of the ideal trajectory of the target 27. In the case where the light concentration position of the illumination light 43 is adjusted as described above, when the trajectory T of the target 27 approaches the ideal trajectory, it is considered that the target 27 is illuminated more brightly by the illumination light 43 and the brightness at the peak position of the light intensity distribution along the first detection axis Aok is increased. Therefore, when the signal intensity $L_N$ on the first detection axis Aok is increased, it is considered that the trajectory T of the target 27 approaches the ideal trajectory, and thus it is considered that the subsequent shift direction D may remain +1.

When the signal intensity $L_N$ on the first detection axis Aok is determined to have increased in S49a ($L_1 > L_0$), the EUV light generation control unit 5 advances processing to S50a. In S50a, the EUV light generation control unit 5 maintains the shift direction D at +1. Further, the value of N is updated by adding 1 to the value of the number of trajectory shifts N.

On the other hand, as can be seen from a comparison between FIG. 9B and FIG. 9G, the brightness at the peak position of the light intensity distribution along the first detection axis Aok may be decreased by controlling the drive stage 26a along the second detection axis Ang in S38a and S33. In this case, it is considered that the subsequent shift direction D should better be reversed.

When the signal intensity $L_N$ on the first detection axis Aok is not increased in S49a ($L_1 \leq L_0$), the EUV light generation control unit 5 advances processing to S51a. In S51a, the EUV light generation control unit 5 reverses the shift direction D by setting the shift direction D to −1. After S50a or S51a, the EUV light generation control unit 5 advances processing to S52a.

4.1.5 Shift of Trajectory T on Second Detection Axis Ang
4.1.5.1 Processing of First Round In S52a, the EUV light generation control unit 5 sets the command position PC on the second detection axis Ang on which the trajectory T is not detected by following Equation (5).

$$PC=PI+D\cdot N\cdot W \quad (5)$$

When processing proceeds from S50a to S52a, the shift direction D is set to +1, and the number of trajectory shifts N is set to 2. Therefore, the command position PC on the second detection axis Ang is set as follows by Equation (5).

$$PC=PI+2\cdot W$$

FIG. 9H shows an example of the initial position PI on the second detection axis Ang and the command position PC when the shift direction D is set to +1 and the number of trajectory shifts N is set to 2. The command position PC is obtained by adding twice the shift width W to the initial position PI. The command position PC obtained by adding twice the shift width W to the initial position PI corresponds to the sixth position in the present disclosure. The processing of shifting the trajectory T of the target 27 to the sixth position and determining whether the trajectory T becomes capable of being detected on the second detection axis Ang in S55a described later constitutes a part of the seventh processing in the present disclosure.

When processing proceeds from S51a to S52a, the shift direction D is set to −1, and the number of trajectory shifts N is set to 1. Therefore, the command position PC on the second detection axis Ang is set as follows by Equation (5).

$$PC=PI-W$$

FIG. 9I shows an example of the initial position PI on the second detection axis Ang and the command position PC when the shift direction D is set to −1 and the number of trajectory shifts N is set to 1. The command position PC is obtained by subtracting the shift width W from the initial position PI. The command position PC obtained by subtracting the shift width W from the initial position PI corresponds to the seventh position in the present disclosure. The processing of shifting the trajectory T of the target 27 to the seventh position and determining whether the trajectory T becomes capable of being detected on the second detection axis Ang in S55a corresponds to the seventh processing in the present disclosure.

Next, in S53a, the EUV light generation control unit 5 controls the drive stage 26a in accordance with the set command position PC. In S53a, the drive stage 26a is controlled in the direction along the second detection axis Ang on which the trajectory T is not detected.

The subsequent processes of S54a, S55a, and S57a are similar to the processes of S34, S35, and S37 in the first embodiment described with reference to FIG. 5. However, if the number of trajectory shifts N is less than the upper limit Nmax (S57a: YES), the EUV light generation control unit 5 advances processing to S59a.

In S59a, the EUV light generation control unit 5 updates the number of trajectory shifts N by adding 1 to the value of N. After S59a, the EUV light generation control unit 5 returns processing to S52a.

4.1.5.2 Processing of Second and Subsequent Rounds

In a case where the shift direction D is maintained at +1 and the number of trajectory shifts N is set to 2 in S50a, when 1 is added to the value of the number of trajectory shifts N in S59a, the number of trajectory shifts N becomes 3. Thereafter, when processing proceeds to S52a, the command position PC on the second detection axis Ang is set as follows by Equation (5).

$$PC=PI+3\cdot W$$

FIG. 9J shows an example of the initial position PI on the second detection axis Ang and the command position PC when the shift direction D is set to +1 and the number of trajectory shifts N is set to 3. The command position PC is obtained by adding three times the shift width W to the initial position PI. The command position PC obtained by adding three times the shift width W to the initial position PI corresponds to the eighth position in the present disclosure. The processing of shifting the trajectory T of the target 27 to the eighth position and determining whether the trajectory T becomes capable of being detected on the second detection axis Ang in S55a constitutes a part of the eighth processing in the present disclosure.

In a case where the shift direction D is reversed to −1 in S51a, when 1 is added to the value of the number of trajectory shifts N in S59a, the number of trajectory shifts N becomes 2. Thereafter, when processing proceeds to S52a, the command position PC on the second detection axis Ang is set as follows by Equation (5).

$$PC=PI-2\cdot W$$

FIG. 9K shows an example of the initial position PI on the second detection axis Ang and the command position PC when the shift direction D is set to −1 and the number of trajectory shifts N is set to 2. The command position PC is obtained by subtracting twice the shift width W from the initial position PI. The command position PC obtained by subtracting twice the shift width W from the initial position PI corresponds to the ninth position in the present disclosure. The processing of shifting the trajectory T of the target 27 to the ninth position and determining whether the trajectory T becomes capable of being detected on the second detection axis Ang in S55a constitutes a part of the eighth processing in the present disclosure.

In this manner, when the command position PC on the second detection axis Ang is changed in one direction in S38a and S33 and the direction is determined to be correct based on the detection result of the signal intensity $L_N$ on the first detection axis Aok, the command position PC is changed in the same shift direction D in S52a through S50a. When the direction is determined to be incorrect, the command position PC is changed to the opposite shift direction D in S52a through S51a. In either case, the distance from the initial position PI is gradually increased each time 1 is added to the value of the number of trajectory shifts N. Every time the position of the trajectory T is shifted, it is determined in S55a whether the trajectory T becomes capable of being detected on the second detection axis Ang. When the trajectory T becomes capable of being detected on the second detection axis Ang, processing proceeds to S60a.

4.1.6 Case where Trajectory T Becomes Capable of being Detected on Second Detection Axis Ang The processes of S60a and S61a when it is determined to be YES in S55a are similar to those of S40 and S41 in the first embodiment described with reference to FIG. 5, respectively. In other respects, the operation of the second embodiment is similar to that of the first embodiment.

4.2 Effect

According to the second embodiment, when the command position PC on the second detection axis Ang is changed in one direction and the direction is determined to be correct, the command position PC is to be changed in the same shift direction D. If the direction is determined to be incorrect, the command position PC is changed to the opposite shift direction D. In either case, the distance from the initial position PI is gradually increased. Every time the position of the trajectory T is shifted, it is determined whether the trajectory T becomes capable of being detected on the second detection axis Ang. Since it is determined whether the space Vxz is positioned in the positive direction or the negative direction with respect to the initial position PI and then the trajectory T is shifted only in the determined direction, the trajectory T can be moved to the space Vxz in a short time.

Further, since the trajectory T is not significantly shifted in the incorrect direction, the trajectory T of the target 27 is suppressed from deviating to a position where the target 27 cannot be collected by the target collection unit 28, and optical components in the EUV light generation apparatus 1 are suppressed from being contaminated with the target substance.

Here, in S38*a* of FIG. 7, in the case that the shift width W is set to be too large, when the trajectory T is shifted on the second detection axis Ang, the trajectory T passes through the peak position Ppeak of the light intensity distribution of the illumination light 43, and there is a possibility that the shift direction D cannot be correctly determined. It is preferable that the shift width W is, for example, equal to or less than the half of the dimension $W_z$ or $W_x$, along the second detection axis Ang, of the detection range Vz or Vx of the trajectory sensor not detecting the trajectory T. On the other hand, when the shift width W is too small, there is a possibility that a significant change in signal intensity cannot be obtained even if the trajectory T is shifted on the second detection axis Ang. The shift width W is, for example, 300 µm or more and 1500 µm or less. The shift width W is preferably 500 µm. The shift width W in the second embodiment corresponds to each of the fifth distance and the seventh distance in the present disclosure. Twice the shift width W corresponds to each of the sixth distance and the ninth distance in the present disclosure. Three times the shift width W corresponds to the eighth distance in the present disclosure.

5. Others

Figure 10:
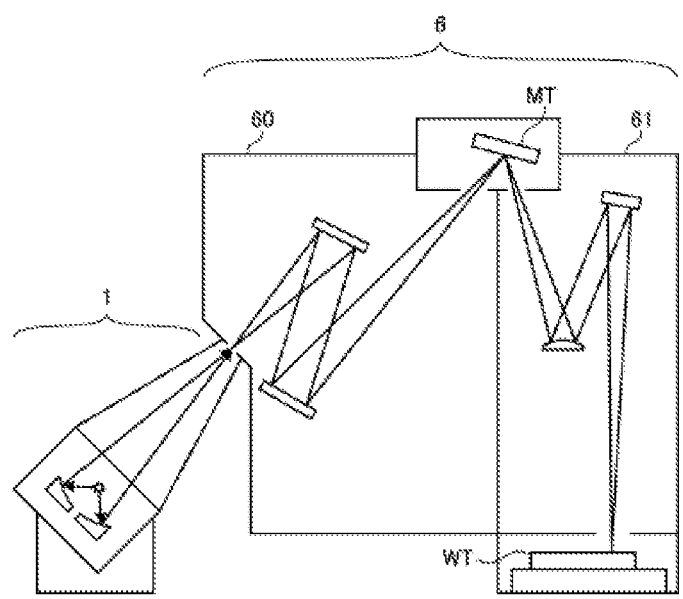
FIG. 10 schematically shows the configuration of an exposure apparatus 6 connected to the EUV light generation apparatus 1.

FIG. 10 schematically shows the configuration of the exposure apparatus 6 connected to the EUV light generation apparatus 1.

In FIG. 10, the exposure apparatus 6 includes a mask irradiation unit 60 and a workpiece irradiation unit 61. The mask irradiation unit 60 illuminates, via a reflection optical system, a mask pattern of the mask table MT with the EUV light incident from the EUV light generation apparatus 1. The workpiece irradiation unit 61 images the EUV light reflected by the mask table MT onto a workpiece (not shown) arranged on a workpiece table WT via a reflection optical system. The workpiece is a photosensitive substrate such as a semiconductor wafer on which photoresist is applied. The exposure apparatus 6 synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. An extreme ultraviolet light generation apparatus configured to generate extreme ultraviolet light by irradiating a target with laser light, comprising:
    a target supply unit configured to output the target;
    an actuator configured to shift a trajectory of the target;
    a first trajectory sensor configured to detect the trajectory of the target in a first direction;
    a second trajectory sensor configured to detect the trajectory of the target in a second direction being different from the first direction; and
    a control unit configured to perform trajectory control including controlling the actuator to cause the second trajectory sensor to be capable of detecting the trajectory of the target when the trajectory of the target has been detected by the first trajectory sensor and has not been detected by the second trajectory sensor, wherein,
    when the first trajectory sensor has detected the trajectory of the target and the second trajectory sensor has not detected the trajectory of the target, the trajectory control includes controlling the actuator so that the trajectory of the target detected by the first trajectory sensor approaches a target position, and thereafter, controlling the actuator so that the second trajectory sensor becomes capable of detecting the trajectory of the target.

2. The extreme ultraviolet light generation apparatus according to claim 1, wherein
    the actuator shifts the trajectory of the target by moving the target supply unit.

3. The extreme ultraviolet light generation apparatus according to claim 1, further comprising
    an illumination device configured to illuminate the target, wherein
    each of the first trajectory sensor and the second trajectory sensor includes an imaging device.

4. The extreme ultraviolet light generation apparatus according to claim 1, wherein
    the control unit controls the target supply unit to stop outputting the target when the trajectory of the target is detected by neither the first trajectory sensor nor the second trajectory sensor.

5. The extreme ultraviolet light generation apparatus according to claim 1, wherein,
    when the trajectory of the target is detected by both the first trajectory sensor and the second trajectory sensor, the control unit controls the actuator so that the trajectory of the target detected by the first trajectory sensor and the trajectory of the target detected by the second trajectory sensor approach corresponding target positions respectively.

6. The extreme ultraviolet light generation apparatus according to claim 1, wherein,
    when the second trajectory sensor remains incapable of detecting the trajectory of the target even with the trajectory control performed, the control unit controls the target supply unit to stop outputting the target.

7. The extreme ultraviolet light generation apparatus according to claim 1, wherein, when the first trajectory sensor has detected the trajectory of the target and the second trajectory sensor has not detected the trajectory of the target, the trajectory control includes controlling the actuator, based on the detection result of the first trajectory sensor, so that the second trajectory sensor becomes capable of detecting the trajectory of the target.

8. The extreme ultraviolet light generation apparatus according to claim 1, wherein
the trajectory control includes fifth processing, when the first trajectory sensor has detected the trajectory of the target and the second trajectory sensor has not detected the trajectory of the target, to control the actuator so that the trajectory of the target is shifted to a fifth position distanced by a fifth distance from a predetermined position in a third direction being different from the second direction and to determine whether the second trajectory sensor becomes capable of detecting the trajectory of the target; sixth processing, when the second trajectory sensor remains incapable of detecting the trajectory of the target even with the fifth processing, to determine change of signal intensity of the first trajectory sensor under the control of the actuator with the fifth processing; and seventh processing, when the signal intensity of the first trajectory sensor is determined to be increased in the sixth processing, to control the actuator so that the trajectory of the target is shifted to a sixth position distanced by a sixth distance being larger than the fifth distance from the predetermined position in the third direction and to determine whether the second trajectory sensor becomes capable of detecting the trajectory of the target, and when the signal intensity of the first trajectory sensor is determined to be decreased in the sixth processing, to control the actuator so that the trajectory of the target is shifted to a seventh position distanced by a seventh distance from the predetermined position in a fourth direction substantially opposite to the third direction and to determine whether the second trajectory sensor becomes capable of detecting the trajectory of the target.

9. The extreme ultraviolet light generation apparatus according to claim 8, wherein
the fifth processing includes determining whether the first trajectory sensor is capable of detecting the trajectory of the target after the actuator is controlled, and the seventh processing includes determining whether the first trajectory sensor is capable of detecting the trajectory of the target after the actuator is controlled.

10. The extreme ultraviolet light generation apparatus according to claim 8, wherein
the trajectory control further includes, when the second trajectory sensor remains incapable of detecting the trajectory of the target even with the seventh processing, eighth processing, when the signal intensity of the first trajectory sensor is determined to be increased with the sixth processing, to control the actuator so that the trajectory of the target is shifted to an eighth position distanced by an eighth distance being larger than the sixth distance from the predetermined position in the third direction and to determine whether the second trajectory sensor becomes capable of detecting the trajectory of the target, and when the signal intensity of the first trajectory sensor is determined to be decreased with the sixth processing, to control the actuator so that the trajectory of the target is shifted to a ninth position distanced by a ninth distance being larger than the seventh distance from the predetermined position in the fourth direction and to determine whether the second trajectory sensor becomes capable of detecting the trajectory of the target.

11. The extreme ultraviolet light generation apparatus according to claim 8, wherein
each of the fifth distance and the seventh distance is equal to or less than the half of a dimension of a detection range of the second trajectory sensor along the third direction.

12. The extreme ultraviolet light generation apparatus according to claim 8, wherein
each of the fifth distance and the seventh distance is 300 µm or more and 1500 µm or less.

13. An extreme ultraviolet light generation apparatus configured to generate extreme ultraviolet light by irradiating a target with laser light, comprising:
a target supply unit configured to output the target;
an actuator configured to shift a trajectory of the target;
a first trajectory sensor configured to detect the trajectory of the target in a first direction;
a second trajectory sensor configured to detect the trajectory of the target in a second direction being different from the first direction; and
a control unit configured to perform trajectory control including controlling the actuator to cause the second trajectory sensor to be capable of detecting the trajectory of the target when the trajectory of the target has been detected by the first trajectory sensor and has not been detected by the second trajectory sensor, wherein
the trajectory control includes first processing, when the first trajectory sensor has detected the trajectory of the target and the second trajectory sensor has not detected the trajectory of the target, to control the actuator so that the trajectory of the target is shifted to a first position distanced by a first distance from a predetermined position in a third direction being different from the second direction and to determine whether the second trajectory sensor becomes capable of detecting the trajectory of the target; and second processing, when the second trajectory sensor remains incapable of detecting the trajectory of the target even with the first processing, to control the actuator so that the trajectory of the target is shifted to a second position distanced by a second distance from the predetermined position in a fourth direction substantially opposite to the third direction and to determine whether the second trajectory sensor becomes capable of detecting the trajectory of the target.

14. The extreme ultraviolet light generation apparatus according to claim 13, wherein
the first processing includes determining whether the first trajectory sensor is capable of detecting the trajectory of the target after the actuator is controlled, and the second processing includes determining whether the first trajectory sensor is capable of detecting the trajectory of the target after the actuator is controlled.

15. The extreme ultraviolet light generation apparatus according to claim 13, wherein
the trajectory control further includes third processing, when the second trajectory sensor has not become capable of detecting the trajectory of the target even with the second processing, to control the actuator so that the trajectory of the target is shifted to a third position distanced by a third distance being larger than the first distance from the predetermined position in the third direction and to determine whether the second trajectory sensor becomes capable of detecting the trajectory of the target; and fourth processing, when the second trajectory sensor remains incapable of detecting the trajectory of the target even with the third processing, to control the actuator so that the trajectory of the target is shifted to a fourth position distanced by a fourth distance being larger than the second distance from the predetermined position in the fourth direction and to determine whether the second trajectory sensor becomes capable of detecting the trajectory of the target.

16. The extreme ultraviolet light generation apparatus according to claim 13, wherein
each of the first distance and the second distance is equal to or less than the half of a dimension of a detection range of the second trajectory sensor along the third direction.

17. The extreme ultraviolet light generation apparatus according to claim 13, wherein
each of the first distance and the second distance is 300 µm or more and 1500 µm or less.

18. A target control method with an extreme ultraviolet light generation apparatus configured to generate extreme ultraviolet light by irradiating a target with laser light, comprising:
in the extreme ultraviolet light generation apparatus, determining whether a trajectory of the target is detected by a first trajectory sensor and a second trajectory sensor, and performing trajectory control including controlling an actuator to cause the second trajectory sensor to be capable of detecting the trajectory of the target when the trajectory of the target has been detected by the first trajectory sensor and has not been detected by the second trajectory sensor,
the extreme ultraviolet light generation apparatus including a target supply unit configured to output the target, the actuator configured to shift the trajectory of the target, the first trajectory sensor configured to detect the trajectory of the target in a first direction, and the second trajectory sensor configured to detect the trajectory of the target in a second direction being different from the first direction, wherein,
when the first trajectory sensor has detected the trajectory of the target and the second trajectory sensor has not detected the trajectory of the target, the actuator is controlled so that the trajectory of the target detected by the first trajectory sensor approaches a target position, and thereafter, the actuator is controlled so that the second trajectory sensor becomes capable of detecting the trajectory of the target.

19. An electronic device manufacturing method, comprising:
generating extreme ultraviolet light by irradiating a target with laser light in an extreme ultraviolet light generation apparatus;
emitting the extreme ultraviolet light to an exposure apparatus; and
exposing a photosensitive substrate to the extreme ultraviolet light in the exposure apparatus to manufacture an electronic device,
the extreme ultraviolet light generation apparatus including a target supply unit configured to output the target, an actuator configured to shift a trajectory of the target, a first trajectory sensor configured to detect the trajectory of the target in a first direction, a second trajectory sensor configured to detect the trajectory of the target in a second direction being different from the first direction, and a control unit configured to perform trajectory control including controlling the actuator to cause the second trajectory sensor to be capable of detecting the trajectory of the target when the trajectory of the target has been detected by the first trajectory sensor and has not been detected by the second trajectory sensor, wherein,
when the first trajectory sensor has detected the trajectory of the target and the second trajectory sensor has not detected the trajectory of the target, the actuator is controlled so that the trajectory of the target detected by the first trajectory sensor approaches a target position, and thereafter, the actuator is controlled so that the second trajectory sensor becomes capable of detecting the trajectory of the target.

* * * * *